(12) United States Patent
Mori et al.

(10) Patent No.: US 7,775,177 B2
(45) Date of Patent: Aug. 17, 2010

(54) CIRCUIT PATTERN FORMING DEVICE AND CIRCUIT PATTERN FORMING METHOD

(75) Inventors: Takashi Mori, Tokyo (JP); Yuji Tsuruoka, Kawasaki (JP); Masao Furukawa, Yokohama (JP); Seiichi Kamiya, Yokohama (JP); Nobuhito Yamaguchi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 1091 days.

(21) Appl. No.: 11/455,637

(22) Filed: Jun. 20, 2006

(65) Prior Publication Data

US 2006/0288932 A1    Dec. 28, 2006

(30) Foreign Application Priority Data

Jun. 22, 2005 (JP) ............................. 2005-181625

(51) Int. Cl.
*B05C 5/02* (2006.01)
(52) U.S. Cl. .................. 118/300; 118/313; 118/323; 347/2; 347/12; 347/13; 347/19
(58) Field of Classification Search ................ 118/313, 118/323, 300; 347/2, 12, 13, 19
See application file for complete search history.

(56) References Cited

U.S. PATENT DOCUMENTS

2004/0095410 A1 * 5/2004 Miyashita .................... 347/19

(Continued)

FOREIGN PATENT DOCUMENTS

JP        11-163499        6/1999

(Continued)

OTHER PUBLICATIONS

Japanese Office Action dated Jun. 28, 2009, issued in corresponding Japanese patent application No. 2005-181625, with an English translation.

*Primary Examiner*—Laura Edwards
(74) *Attorney, Agent, or Firm*—Fitzpatrick, Cella, Harper & Scinto

(57) ABSTRACT

A circuit pattern forming device includes a liquid ejection device that ejects an insulating pattern forming solution and a conductive pattern forming solution onto a substrate to form insulating dots of the insulating solution and conductive dots of the conductive solution on the substrate. A control device controls an ejection operation that the liquid ejection device performs for each of the solutions. A moving device moves the liquid ejection device and the substrate relative to each other to form a circuit pattern composed of a plurality of the conductive dots and the insulating dots. The liquid ejection device includes a first nozzle array in which a plurality of nozzles for ejecting the insulating solution are arranged along a crossing direction crossing a main scan direction, and a second nozzle array in which a plurality of nozzles for ejecting the conductive solution are arranged along the crossing direction. The first nozzle array is disposed in front of the second nozzle array with respect to the main scan direction and the second nozzle array is arranged between a plurality of the first nozzle arrays. When the insulating dots and the conductive dots are formed close to each other on the substrate, the insulating dots, which are positioned in a direction in which the liquid ejection device moves relative to the substrate, are formed on the substrate prior to the conductive dots in a same main scan performed by the liquid ejection device.

3 Claims, 14 Drawing Sheets

U.S. PATENT DOCUMENTS

| | | | |
|---|---|---|---|
| 2005/0243113 A1* | 11/2005 | Takahashi et al. | 347/12 |
| 2006/0288932 A1 | 12/2006 | Mori et al. | 118/313 |
| 2006/0290736 A1 | 12/2006 | Mori et al. | 347/19 |
| 2006/0292496 A1 | 12/2006 | Furukawa et al. | 430/311 |

FOREIGN PATENT DOCUMENTS

| | | |
|---|---|---|
| JP | 11-274671 | 10/1999 |
| JP | 2003-318133 | 11/2003 |

\* cited by examiner

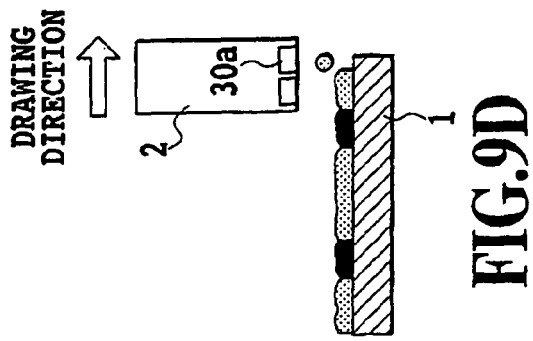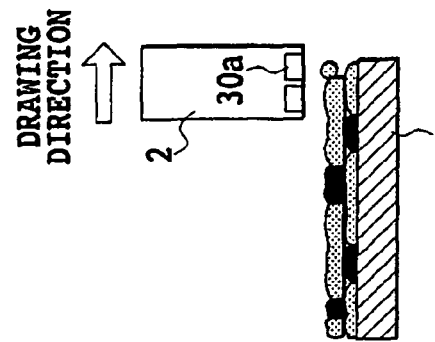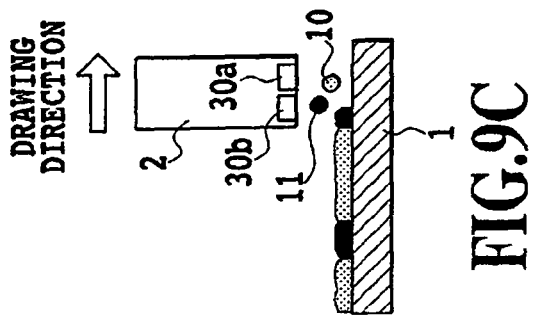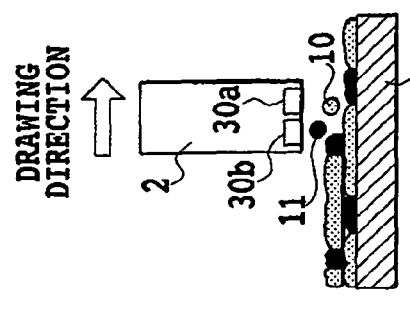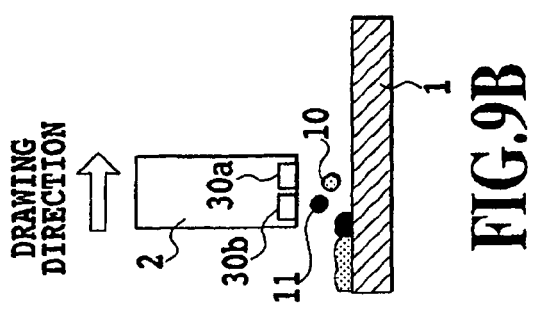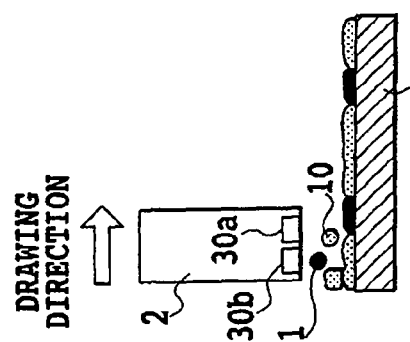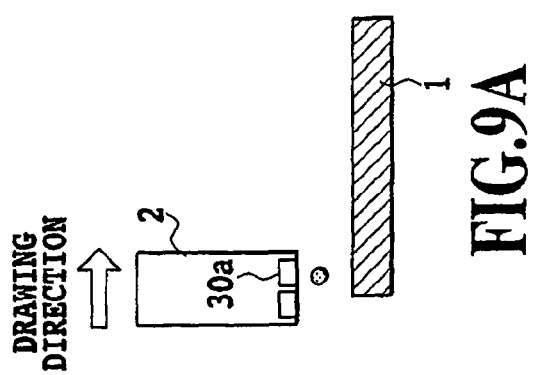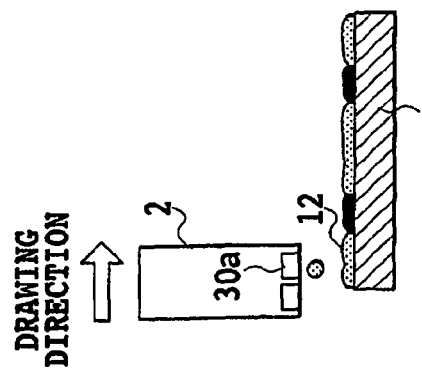

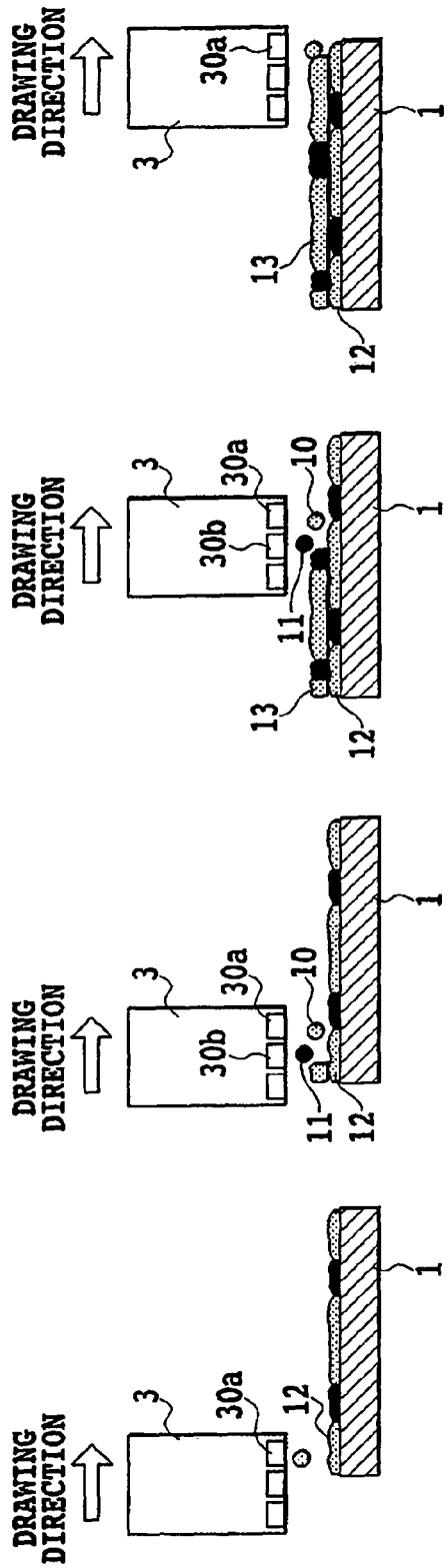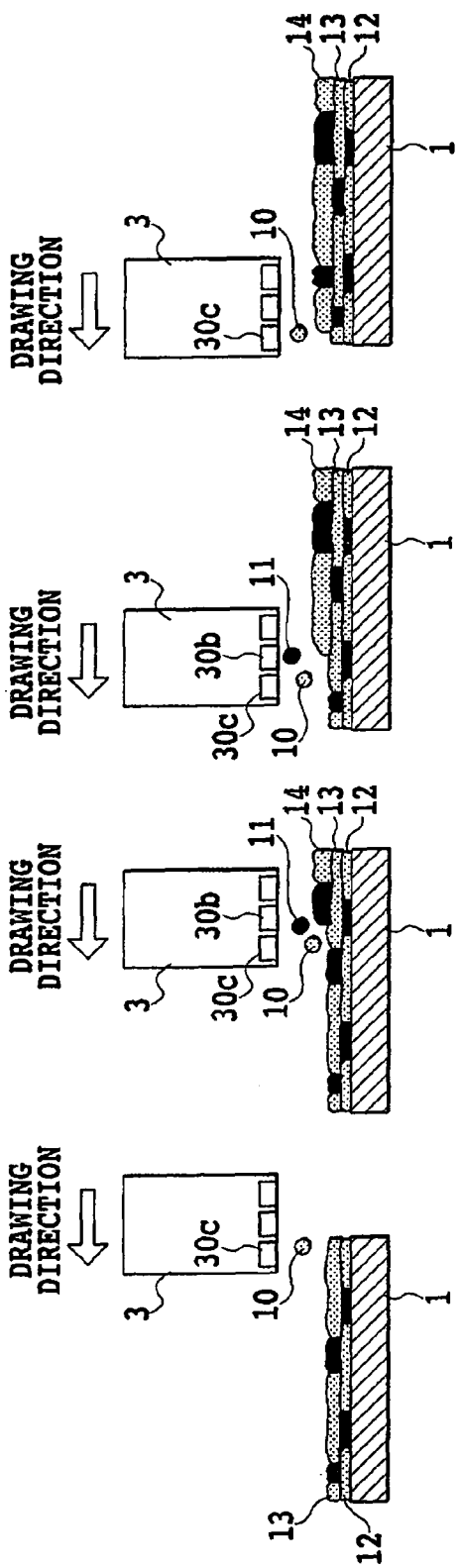

CIRCUIT PATTERN FORMING DEVICE AND CIRCUIT PATTERN FORMING METHOD

BACKGROUND OF THE INVENTION

This application claims priority from Japanese Patent Application No. 2005-181625, filed Jun. 22, 2005, which is hereby incorporated by reference herein.

FIELD OF THE INVENTION

The present invention relates to a circuit pattern forming device and a circuit pattern forming method to form circuits by ejecting a conductive solution and an insulating solution onto a substrate used in electronic devices, electrical devices, computers and communication devices.

DESCRIPTION OF THE RELATED ART

Printed circuit boards installed in electronic devices, communication devices and computers are mounted with a variety of kinds of semiconductor devices, such as LSIs, and various electronic components. Many kinds of printed circuit boards are available, including those that use ceramics as a base material, those using as a base material a composite material formed of a reinforcement material, such as glass fibers and a synthetic resin, such as epoxy resin, and those using a flexible film, such as polyester resin and aramid resin, as the base material. Most of the conventional printed circuit boards have used a one-sided or a double-sided substrate. As electronic devices have been miniaturized and packed in higher density, laminated circuit patterns have come to be used. At present, eight- or sixteen-layer printed circuit boards are becoming mainstream. At the same time, circuit patterns are also being formed of increasingly finer circuits, and their density is rapidly decreasing.

Circuit patterns on a printed circuit board are generally formed by a subtractive method. The subtractive method of circuit formation involves a hole opening step, a non-electrolytic plating step, a patterning step using dry films, an electrolytic step, an etching step, and a solder removing step. Because it performs many steps and, thus, takes a substantially long to complete its process, the subtractive method has a disadvantage that its process cost occupies a larger percentage of an overall manufacturing cost. A reduction in the process cost has become an important issue in the printed circuit board industry. There is another problem of disposing of waste liquid that is produced during the plating step and the etching step.

To deal with these problems, a circuit forming method is disclosed in Japanese Patent Application Laid-open No. 11-163499. This method forms circuit patterns by directly ejecting a conductive pattern forming solution and an insulating pattern forming solution through an ink jet system onto a substrate surface to draw a conductive pattern and an insulating pattern. This method, however, has a problem that, since the conductive pattern forming solution and the insulating pattern forming solution mix at a boundary surface, the circuit patterns bleed, making it difficult to further miniaturize the circuit patterns and increase their density.

Under these circumstances, a method has been proposed which, as disclosed in Japanese Patent Laid-open No. 2003-318133, pattern wires are arranged with high precision to ensure insulation between wires, and, thereby, preventing wires arranged close together from coming into contact with one another.

The method of Japanese Patent Application Laid-open No. 2003-318133 ejects a plurality of droplets in a manner that keeps them from not mixing together, to form a plurality of film patterns at adjoining positions with high precision. With this method, however, although a plurality of film patterns can be formed at adjoining positions in the same layer, any landing position errors of droplets may result in a pattern of one layer coming into contact with near circuits in the next layer down, forming short-circuits. FIGS. 14A and 14B show an example case wherein a droplet lands at a deviated position when the method of Japanese Patent Application Laid-open No. 2003-318133 is employed. When, as shown in FIG. 14A, a second layer (upper layer) is formed over a first layer (lower layer) on a substrate 1001, a conductive solution 1011 and an insulating solution 1010 are ejected from a nozzle 1003 and a nozzle 1004, respectively, of a head 1002, as the head is moved in the scan or drawing direction (from left to right in the figure). If, during this process, the conductive solution 1011 lands at deviated positions, a conductive pattern 1005 of the first layer will likely contact a conductive pattern 1006 of the second layer, causing a short-circuit, as shown in FIG. 14B. Since printed circuit boards have increasingly higher circuit densities in recent years, it is required that circuit patterns be able to be formed with high precision, not only in the same layer, but also, in multiple stacked layers.

The present invention has been accomplished with a view to overcome the above problems experienced with conventional technologies. It is, therefore, an object of this invention to provide a reliable circuit pattern forming device and method, which can cause the conductive solution to land on the substrate with high precision and which, when forming a multilayer printed circuit board, can prevent closely located wires from contacting each other. It is also an object of this invention to provide a liquid ejection head used in the circuit pattern forming device.

SUMMARY OF THE INVENTION

To solve the above conventional problems, the present invention has the following construction.

That is, according to a first aspect, the present invention provides a circuit pattern forming device comprising liquid ejection means for ejecting an insulating pattern forming solution and a conductive pattern forming solution onto a substrate to form insulating dots of the insulating solution and conductive dots of the conductive solution on the substrate, moving means for moving the liquid ejection means and the substrate relative to each other to form a circuit pattern composed of a plurality of the conductive dots and the insulating dots, and control means for performing control, such that when the insulating dots and the conductive dots are formed close to each other on the substrate, the insulating dots that are arranged in a direction in which the liquid ejection means moves relative to the substrate are formed on the substrate prior to the conductive dots.

According to a second aspect, the present invention provides a circuit pattern forming method having liquid ejection means for ejecting an insulating pattern forming solution and a conductive pattern forming solution onto a substrate to form insulating dots of the insulating solution and conductive dots of the conductive solution on the substrate, and moving means for moving the liquid ejection means and the substrate relative to each other to form a circuit pattern composed of a plurality of the conductive dots and the insulating dots, the method comprising the step of, when the insulating dots and the conductive dots are formed close to each other on the substrate, forming on the substrate prior to the conductive dots, the insulating dots that are arranged in a direction in which the liquid ejection means moves relative to the substrate.

In this specification, dots of the insulating solution formed on the substrate by ejecting the insulating pattern forming solution from the liquid ejection head onto the substrate are called insulating dots. Further, dots of the conductive solution formed on the substrate by ejecting the conducting pattern forming solution from the liquid ejection head onto the substrate are called insulating dots.

With this invention, when droplets of insulating solution and droplets of conductive solution land close to each other, the droplets of insulating solution are made to land on the substrate before the droplets of conductive solution, so that the insulating solution prevents the conductive solution from spreading. This enables the conductive solution to land with high precision, making it possible to keep the closely arranged wires from contacting each other when a multilayer printed circuit board is fabricated, and to provide a highly reliable circuit pattern forming device.

The above and other objects, effects, features and advantages of the present invention will become more apparent from the following description of embodiments thereof, taken in conjunction with the accompanying drawings.

BRIEF DESCRIPTION OF THE DRAWINGS

FIGS. 9A to 9H are a rough sequence of steps showing a circuit pattern forming process in a first embodiment of this invention;

FIGS. 10A to 10H are a rough sequence of steps showing a circuit pattern forming process in a second embodiment of this invention;

DETAILED DESCRIPTION OF THE PREFERRED EMBODIMENTS

Embodiments of this invention will be explained in the following order.
1. Construction of Circuit Pattern Forming Device
2. Configuration of Control System
3. Control Circuit Forming Position
4. Material used in Circuit Pattern Forming Process
4-1. Substrate
4-2. Conductive Pattern Solution and Insulating Pattern Solution
5. Circuit Pattern Forming Process

[1. Construction of Circuit Pattern Forming Device]

As one embodiment of this invention, a circuit pattern forming device used to form a circuit pattern made up of an insulating pattern and a conductive pattern on a substrate will be described.

Figure 1:
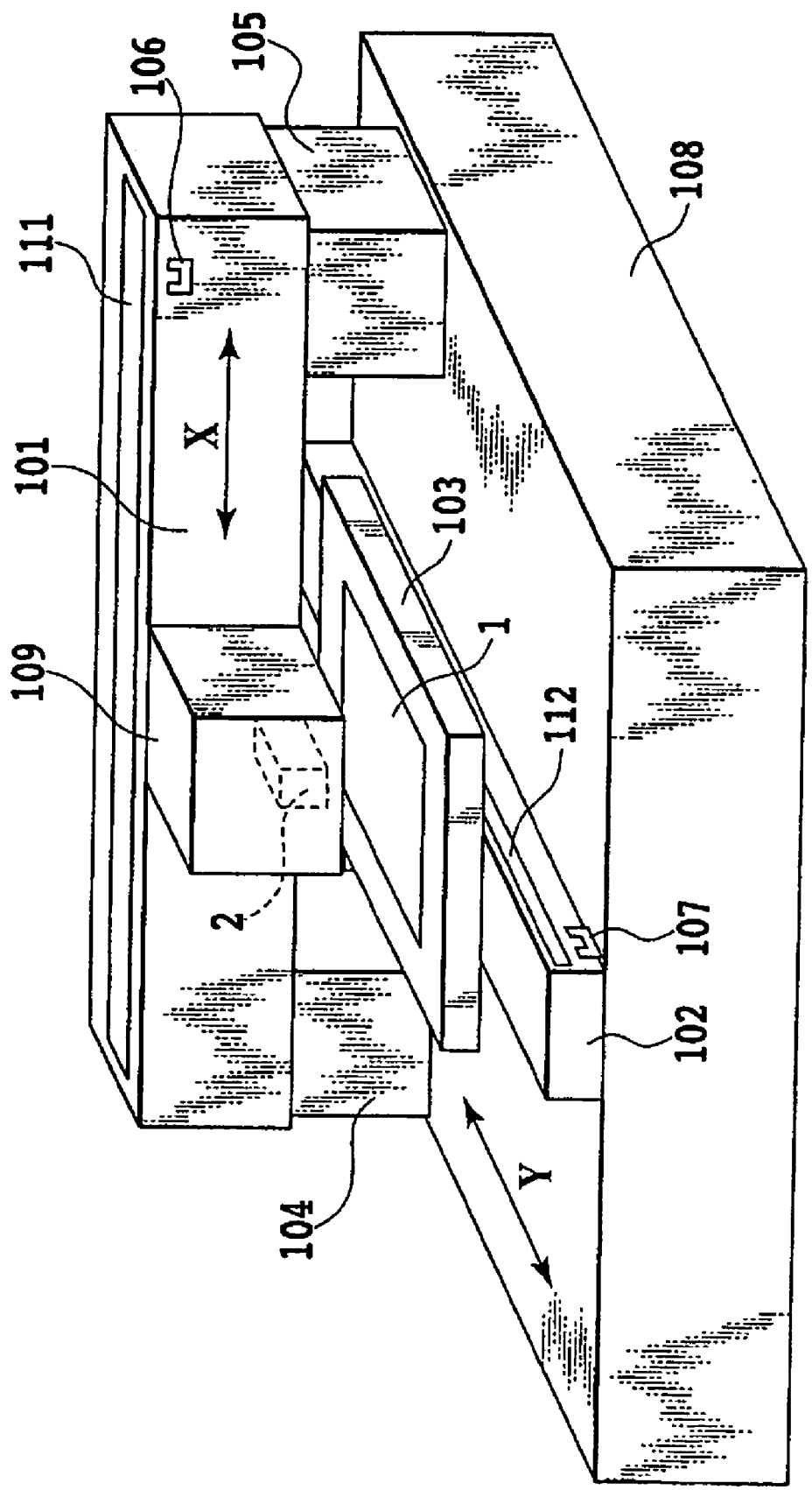
FIG. 1 is a perspective view showing an outline construction of a circuit pattern forming device used in this embodiment.

The circuit pattern forming device of FIG. 1, used in this embodiment, has a carriage (moving means) 109, in which are installed a liquid ejection head 2 for ejecting an insulating pattern solution and a conductive pattern solution onto the substrate 1 and two tanks (not shown) for supplying these solutions to the liquid ejection head 2, and a stage 103 on which the substrate 1 is mounted.

Figure 2:
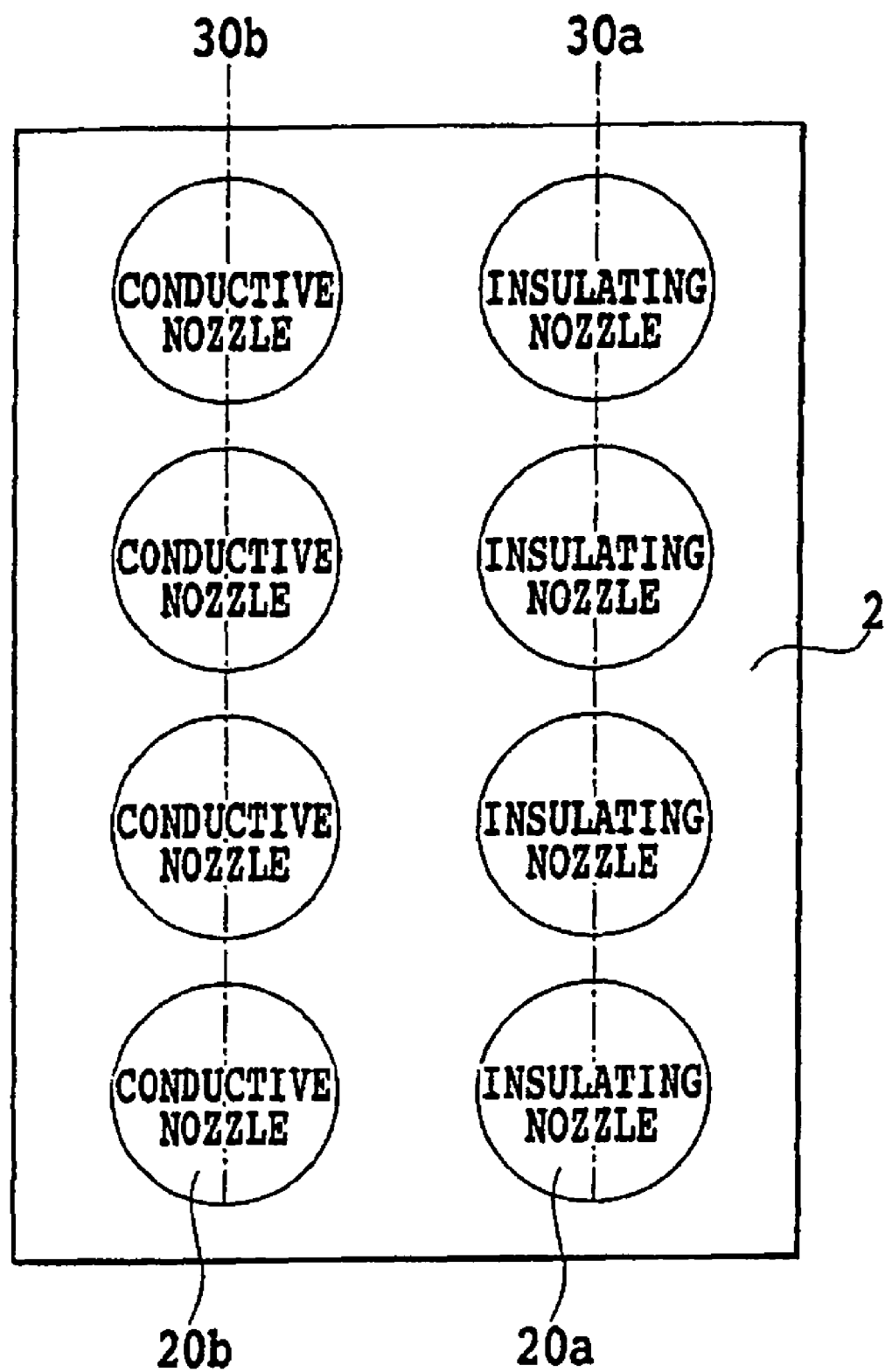
FIG. 2 is a bottom view schematically showing nozzle arrays arranged on an orifice face of the liquid ejection head 2.

FIG. 2 schematically illustrates nozzle arrays arranged in the orifice face of the liquid ejection head 2. As shown in FIG. 2, the liquid ejection head 2 has arranged, in parallel thereon, a first nozzle array 30a, in which nozzles 20a to eject the insulating pattern solution are arrayed at equal intervals, and a second nozzle array 30b, in which nozzles 20b to eject the conductive pattern solution are arrayed, at equal intervals.

In FIG. 1, a CR linear motor (carriage linear motor) 101 drives the carriage 109 in a forward direction (also referred to as a forward scan) and in a backward direction (also referred to as a backward scan). As a means for moving the substrate 1 in a Y direction, there are provided the stage 3 and an LF linear motor (line feed linear motor) 102. The LF linear motor 102 is firmly secured to a flat bed 108, so that the upper surface of the stage 103 carrying the substrate 1 can be kept parallel to the upper surface of the bed 108 at all times, if the stage 103 is moved. The CR linear motor 101 is secured to highly rigid bases 104, 105 erected on the bed 108.

The carriage 109 reciprocally moves in the main scan direction (X direction) along an upper surface of the bed, i.e., a stage surface. The CR linear motor 101 and the LF linear motor 102 each incorporate a linear encoder 111, 112 and an origin sensor 106, 107. The outputs of the linear encoder 11, 112 and the origin sensor 106, 107 are used as a servo control input for driving the linear motors. Further, the linear encoder 111 on the carriage side is used to generate a solution ejection timing.

Further, the circuit pattern forming device of this embodiment is connected with a personal computer (not shown), as a host device. Based on figure information (circuit pattern forming information) sent from this personal computer, the circuit pattern forming device moves the liquid ejection heads 2, 3, ejects solutions and moves the stage 103 to form a circuit pattern on the surface of the substrate 1.

A heater (not shown) is embedded in a lower part of the stage 103 on which the substrate 1 is mounted. The heater heats the circuit pattern drawn on the substrate to fix it. In this embodiment, since the heater is intended to fix the printed circuit pattern, its heating temperature is set to 40-70°, enough to fix the pattern even in this simple construction. With the fixing complete, no functional problem will arise in the printed circuit board. However, for an improved conductivity of the conductive pattern and an improved insulation performance of the insulating pattern, the printed circuit board may be burned in a separate baking device.

[2. Configuration of Control System]

Next, the control system for the circuit pattern forming device in this embodiment will be described.

Figure 3:
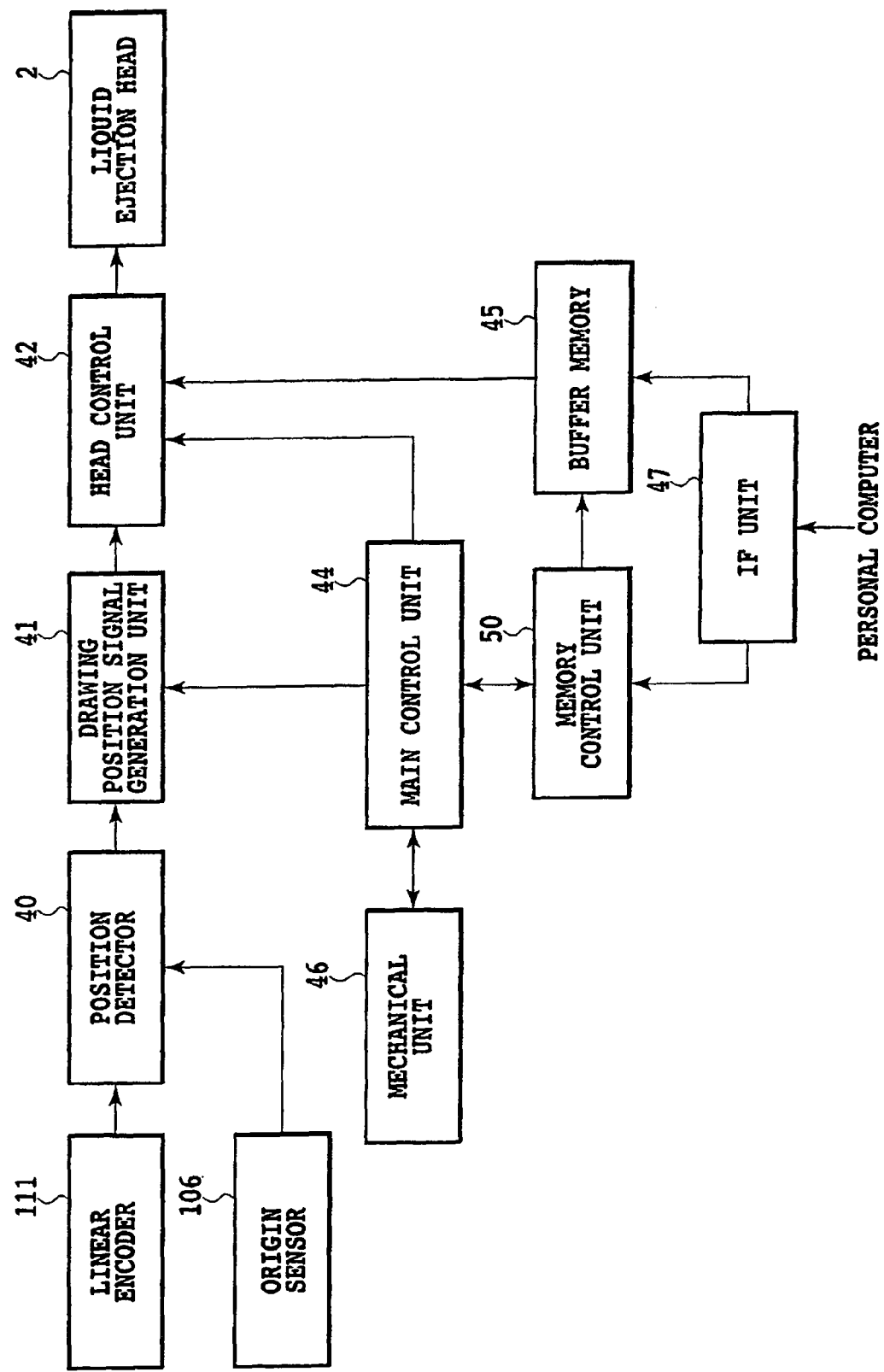
FIG. 3 is a block diagram schematically showing an overall configuration of a control system installed in the circuit pattern forming device in the embodiment of this invention.

FIG. 3 is a block diagram schematically showing an overall configuration of the control system in the circuit pattern forming device of this embodiment. A mechanical unit 46 includes the CR linear motor 101 for moving in the main scan direction the carriage 109 carrying the liquid ejection head 2, and also, the LF linear motor 102 for transporting the stage 103 carrying the substrate 1.

A main control unit 44 is a central part of the control system that controls the entire circuit pattern forming device of this embodiment, including the liquid ejection head and the mechanical unit 46. The main control unit 44 has a CPU, a ROM in which operation programs are stored, and a work RAM that allows reading and writing of a variety of data.

The main control unit 44 outputs a control signal to the mechanical unit 46 to perform a mechanical control, for example, on the movement of the carriage 109 and stage 103. It also transfers signals to and from a head control unit 42, a memory control unit 50 and a drawing position signal generation unit 41, to control the operation of the liquid ejection head 2. An UF unit 47 is an interface between the personal computer (not shown) and the circuit pattern forming device. The UF unit 47 receives a command and circuit pattern drawing data (circuit pattern data) from the host (personal computer). The memory control unit 50 transfers the command from the UF unit 47 to the main control unit 44 and, under the control of the main control unit 44, generates an address signal and a write timing signal to write the circuit pattern drawing data into a buffer memory 45.

Further, the main control unit 44 analyzes the command received from the UF unit 47 and, according to the result of the analysis, sets drawing conditions, such as a drawing speed and a drawing resolution. Then, based on the drawing conditions, the main control unit 44 controls the mechanical unit 46 and the drawing position signal generation unit 41 to execute the drawing operation under the predetermined conditions.

Further, the circuit pattern drawing data received form the personal computer (not shown) is stored in the buffer memory 45 or a temporary memory, and then, transferred to the head control unit 42 by the control of the memory control unit 50 that has received the command from the main control unit 44.

In synchronism with the drawing position signal output from the drawing position signal generation unit 41, the head control unit 42 drives individual nozzles of the liquid ejection head to write a circuit pattern according to the circuit pattern drawing data transferred from the buffer memory 45.

The buffer memory 45 has a memory capacity sufficient to store more than one band of drawing data that the liquid ejection head 2 requires in performing one complete drawing scan in the main scan direction.

[3. Control of Circuit Forming Position]

Next, the drawing position control method in the circuit pattern forming device of this embodiment will be described.

Figure 4A:
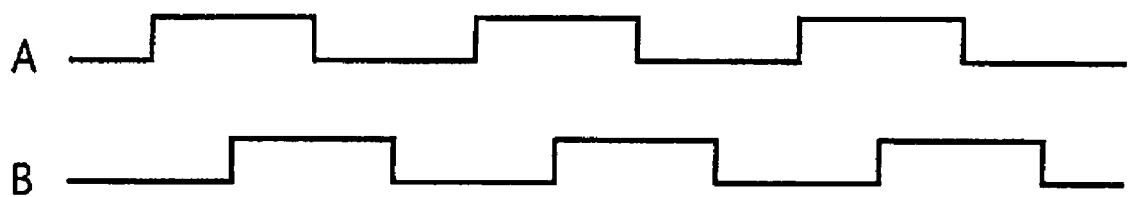
FIGS. 4A and 4B are output signals from a linear encoder in the embodiment of this invention.
Figure 4B:
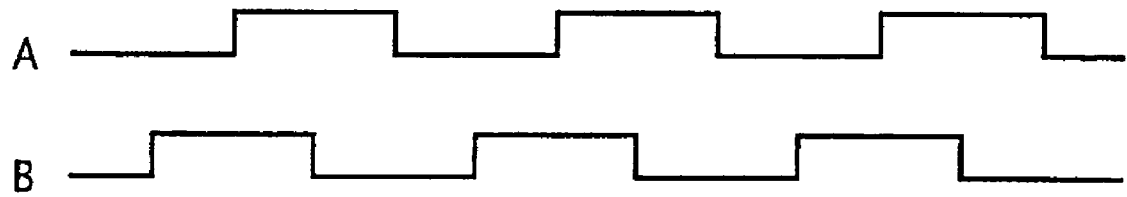

FIGS. 4A and 4B show output signals from the linear encoder 111. In the figure, two signals A and B, ninety degrees out of phase with each other, are generated by the linear encoder 111. FIG. 4A shows signals A, B generated when the carriage 109 moves in the forward direction, and FIG. 4B shows signals A, B generated when the carriage 109 is moving in the backward direction. In this state, the pulse signal is counted down.

By counting the output signal from the linear encoder 111, as described above, the mobility position of the moving carriage 109 can be determined. That is, a position detector 40 in FIG. 3 receives the two signals from the linear encoder 111 and the original signal Z from the origin sensor 106, and determines a present absolute position of the carriage 109 in the main scan direction, i.e., the position from the origin.

Figure 5:
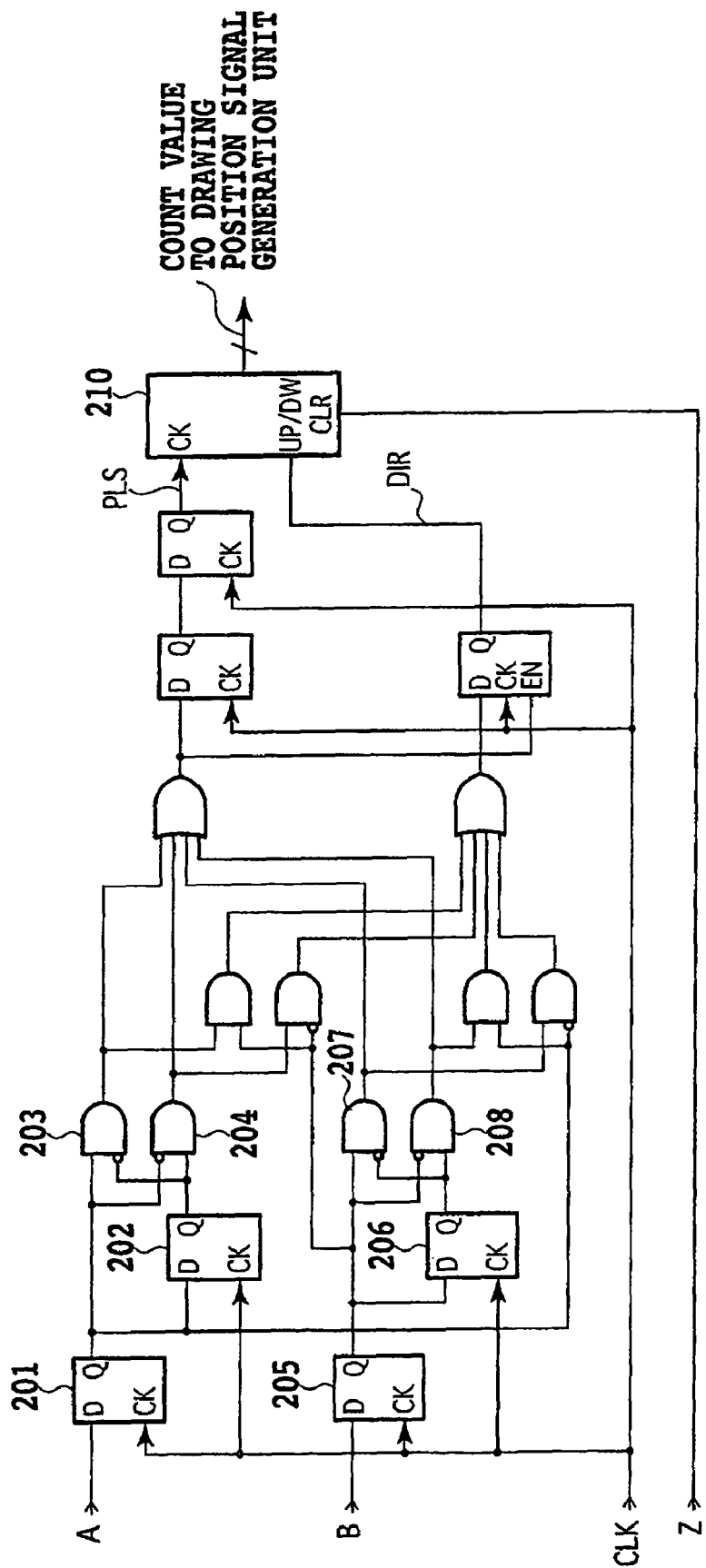
FIG. 5 is a block diagram showing an example circuit of a liquid ejection head position detector in the embodiment of this invention.

FIG. 5 shows an example circuit of the head position detector 40. The head position detector 40 produces a count signal (PLS) and an up/down signal, namely, a travel direction signal (DIR), based on the signal A, B from the linear encoder 111, the original signal Z from the origin sensor 106, and a clock (CLK) for synchronization of logic timing. Components 201 through 204 in FIG. 5 constitute a circuit that detects timing of the rising and trailing edges of the signal A. A pulse synchronized with the rising edge of the signal A is output from the circuit 203, while a pulse synchronized with the trailing edge is output from the circuit 204.

Similarly, a circuit made up of components 205-208 of FIG. 5 detects the leading and trailing edges of the signal B. A pulse synchronized with the leading edge of the signal B is output from the circuit 207, while a pulse synchronized with the trailing edge is output from the circuit 208.

Figure 6:
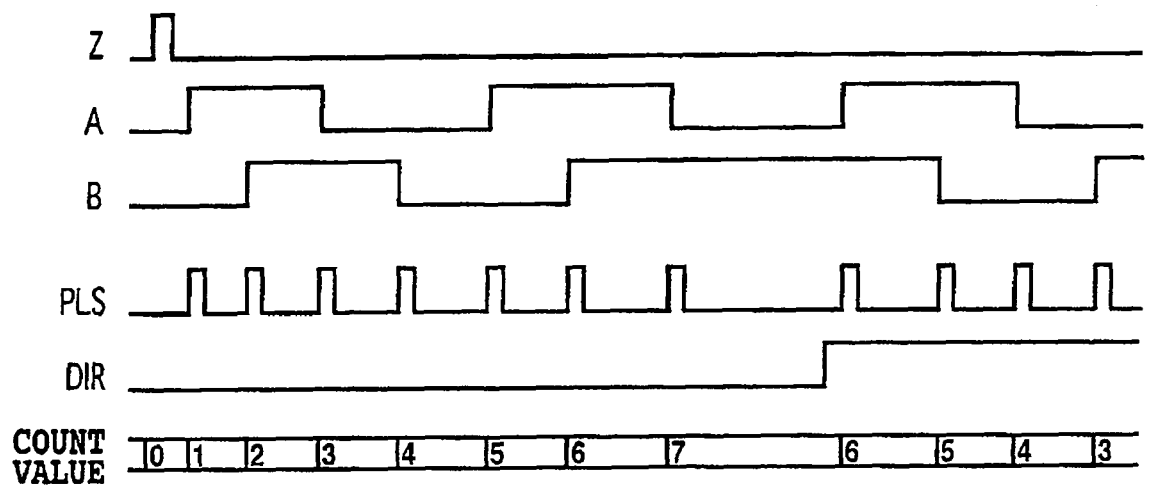
FIG. 6 is a timing chart showing output signals from various parts of the circuit of FIG. 5.

FIG. 6 is a timing chart showing output signals produced by various parts of the circuit of FIG. 5.

In FIG. 6, since the phase of the signal A leads the phase of signal B by ninety degrees, the travel direction signal DIR is low, representing the backward movement of the head. Conversely, from a middle point of FIG. 6 on, the signal A lags signal B, so the travel direction signal DIR goes high, representing the backward movement of the head. The count signal PLS is output at the rising and trailing edges of the two signals A, B.

The original signal Z, the count signal PLS and the travel direction signal DIR are connected to input terminals of the up/down counter 210—reset (CLR), clock (CLK) and up/down (UP/DW). Thus, when the cartridge 109 moves to the origin position (home position) in response to an initialize command from the main control unit 44, the original signal Z becomes active, clearing the count value to zero (count value=0). From this time on, with the count value=0 taken as an origin, the absolute position of the carriage 109 in the main scan direction is counted, and the count value is output to the drawing position signal generation unit 41.

Figure 7:
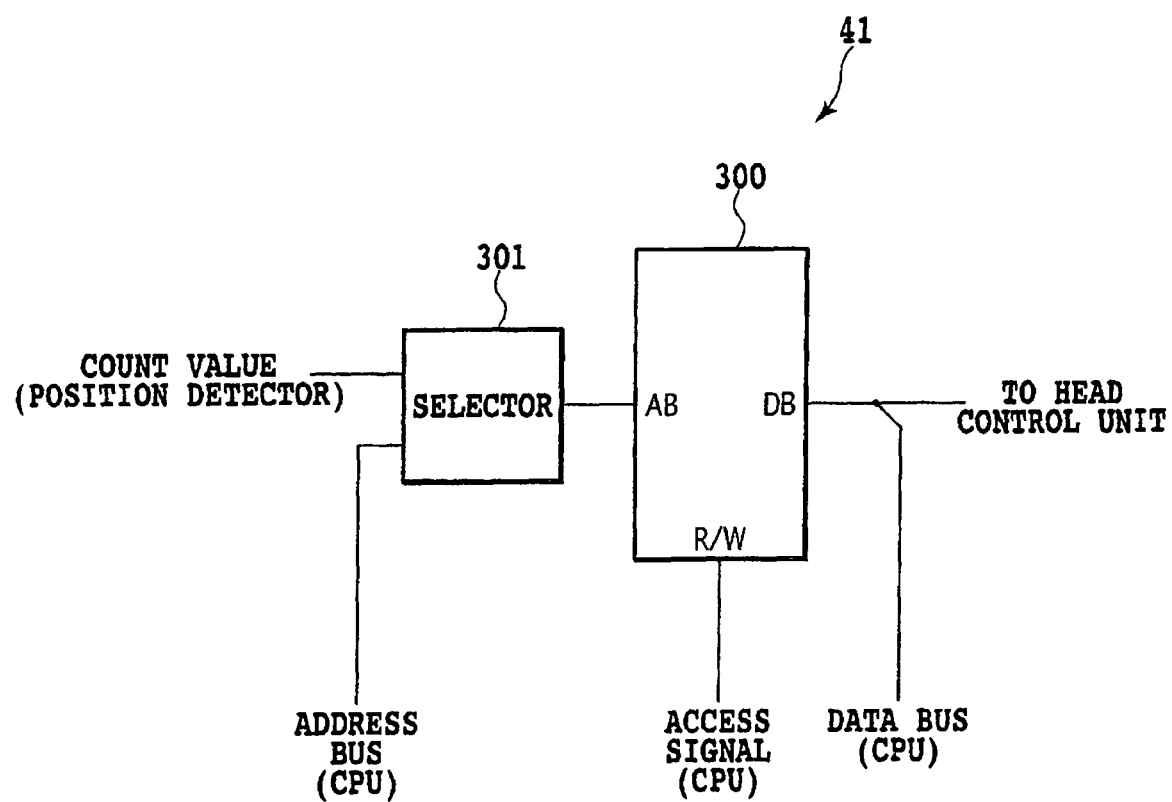
FIG. 7 is a block diagram showing a drawing position signal generator of FIG. 3.

FIG. 7 is a block diagram of the drawing position signal generation unit 41. The count value generated by the head position detector 40 is connected via a selector 301 to an address input terminal (AB terminal) of the RAM 300. For direct reading/writing from the CPU of the main control unit 44, an address bus is connected via the selector 301 to the address input terminal of the RAM 300. Further, a data bus of the CPU in the main control unit 44 is connected to a data bus terminal (DB terminal) of the RAM 300 and an access signal of the CPU is connected to a R/W terminal of the RAM 300.

When writing data from the main control unit 44 into the RAM 300, the selector 301 is switched to the CPU side. During the drawing operation, the selector 301 is switched, so that the count value is supplied to the address input of the RAM 300. As the carriage 109 travels, the RAM data of an address representing the position of the carriage 109 is output to the head control unit 42.

With the drawing data written into RAM 300 in advance from the CPU of the main control unit 44, a drawing position pulse is output to the head control unit 42 each time the carriage 109 reaches the drawing position. Upon receiving the drawing position pulse, the head control unit 42 drives the liquid ejection head 2, to eject a solution to the substrate 1.

Figure 8:
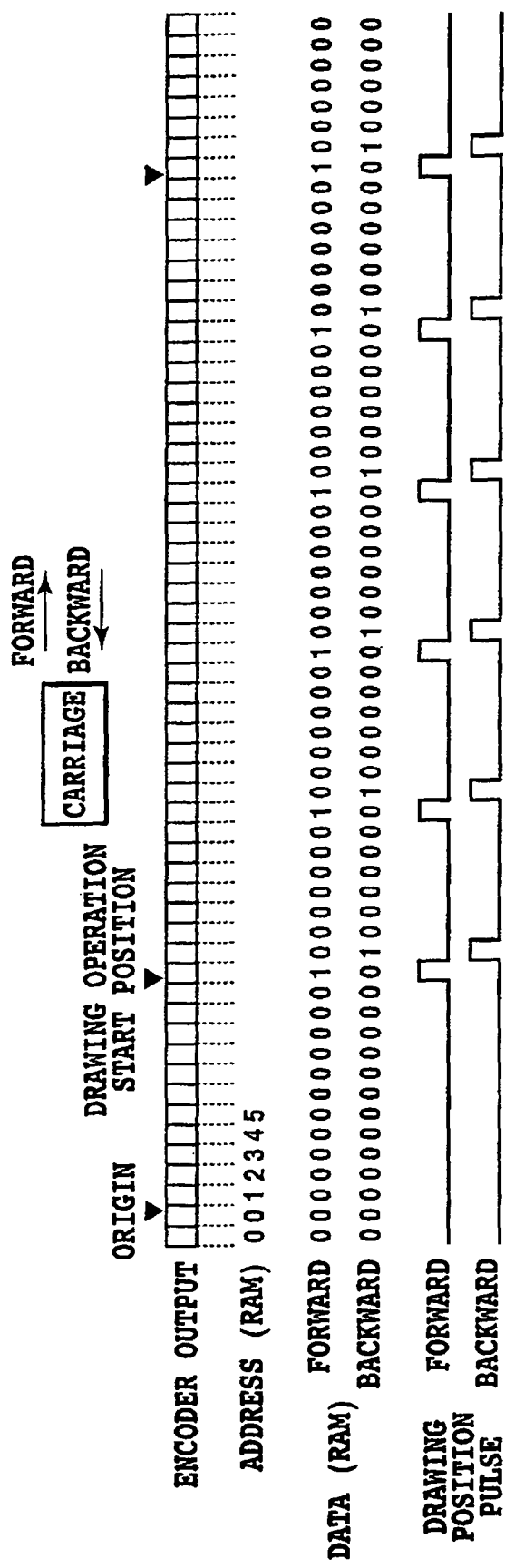
FIG. 8 is a timing chart showing an output timing of the drawing position pulse in the embodiment of this invention.

FIG. 8 is a timing chart showing an output timing of the drawing position pulse.

In FIG. 8, the address and data (RAM) represent an address and data of the RAM 300, respectively, showing two bits of data written into the RAM 300, one bit for the forward movement and one bit for the backward movement. The drawing position pulse in FIG. 8 is a pulse signal to provide the head control unit 42 with a drawing timing. When the carriage 109 moves, the bit corresponding to the forward or backward direction is selected and output, as shown in FIG. 8.

The forward direction pulse and the backward direction pulse shown in FIG. 8 do not agree in output timing. The reason for this is that even if the head ejects droplets at the same position in the scan direction, the droplet landing positions on the substrate differ, depending on whether the liquid ejection head is moving in the forward direction or backward direction. That is, a droplet ejected when the head is moving in the forward direction shifts forward until it lands on the substrate. Conversely, a droplet ejected when the head is moving in the backward direction shifts backward. Therefore, the drawing position pulse timings are set so as to differentiate the droplet ejection position between the forward and backward head movements.

In FIG. 8, the drawing position pulse timing has been explained by taking as an example a bidirectional drawing operation, in which the liquid ejection head performs drawing both in the forward and backward directions. In a one-way drawing operation, in which the drawing is done only in the forward direction, all the bits for the backward movement need to be set to zero. In this case, the drawing position pulse is not output when the carriage is moving in the backward direction.

While in FIG. 8 the data and the drawing position pulses for the RAM 300 are shown for only one set of forward and backward movement for convenience, if the liquid ejection head 2 has a plurality of nozzle arrays (n columns), as in this embodiment, or if there are two or more heads 2 (m heads), the number of data bits in the RAM 300 need only be increased to generate data for n columns or for m sets.

[4. Material used in Circuit Pattern Forming Process]

[4-1. Substrate]

The substrate 1 used in this invention is shaped planar in the form of a film, a sheet and a plate. Because forming a circuit pattern layer includes a baking step, the substrate preferably has high heat resistance. A substrate with a curved surface, rather than a planar surface, may be used if it can be formed with circuit patterns by the ink jet system. The substrate may use materials such as ceramics, which are made to sinter alumina-silica, thermoplastic resin films, such as polyester film aromatic polyamide film and polyimide film, cloth and non-woven fabric of glass fibers, polyester fibers and aromatic polyamide fibers impregnated with thermoplastic resin and epoxy resin and then hardened and shaped like a sheet, a glass epoxy laminated plate used for ordinary printed circuit boards, and permeable substrate, paper and cloth. It is desired that the substrate used in this invention has a hydrophilic property. It is particularly preferred that the substrate be surface-treated, so that the solution that has landed on the substrate has a surface tension sufficient to prevent it from spreading and wetting the substrate surface. Even those substrates with water repellency may be used, as long as they are given the similar surface treatment.

[4-2. Conductive Pattern Solution and Insulating Pattern Solution]

Now, the conductive pattern solution and insulating pattern solution used in this embodiment will be explained.

The conductive pattern solution used in this embodiment includes water and a conductive material. Water used to prepare the conductive pattern solution is preferably industrial water removed of cations and anions by a deionization process. The amount of water in the conductive pattern solution is determined in a wide range according to a water percentage required or characteristics required of the conductive pattern solution. Generally, the water content falls in a range of 10-98 weight percentage and, preferably, in a range of 40-90 weight percentage.

A conductive material used in the conductive pattern solution is, for example, metal superfine particles less than 1-100 nm in average diameter that are manufactured by laser abrasion. The metal superfine particles may include, for example, ITO (indium-tin oxide) and $SnO_2$ (tin oxide).

The insulating pattern solution used in this invention contains water, an insulating material and a second component. The second component is an alkaline water solution which, when it comes into contact with the conductive material used in the conductive pattern solution, causes an interface coagulation at a contact area by a coagulation sedimentation reaction based on a pH difference, preventing a mixing or bleeding of the conductive pattern solution and the insulating pattern solution, keeping these solutions isolated from each other. This alkaline water solution evaporates during thermosetting processing performed as post processing. The water used in the insulating pattern solution may be the one used in the conductive pattern solution.

A material that may be used as the second component includes any kind of polymer, such as an anionic water-soluble polymer and a volatile amine. The anionic water-soluble polymer as the second component may include ammonium salt and the volatile amine may include ammonium hydroxide. As the insulating material, a nonionic polymer may be used. An example of the nonionic polymer includes a solder resist containing epoxy resin as the main component.

[5. Circuit Pattern Forming Process]

First Embodiment

FIGS. 9A to 9H are a rough sequence of steps showing a circuit pattern forming process in a first embodiment of this invention. In the first embodiment, the liquid ejection head 2, having insulating nozzles and conductive nozzles arrayed side by side, as shown in FIG. 2, is used.

First, the process of forming a first layer of the pattern will be explained. As shown in FIG. 9A, the liquid ejection head 2 is moved to the left end of the substrate 1 (to the left side in the figure), which is the drawing operation start position. Then, a droplet 10 of the insulating pattern solution is ejected from a nozzle 20a of the nozzle array 30a of the head 2, to form a dot of the insulating pattern solution (referred to as an insulating dot) on the substrate. A droplet 11 of the conductive pattern solution is ejected from a nozzle 20b of the nozzle array 30b of the head 2, to form a dot of the conductive pattern solution (referred to as a conductive dot) on the substrate 1.

According to the drawing position control explained by referring to FIG. 3, FIG. 7 and FIG. 8, each time the liquid ejection head 2 moves to the drawing position, a drawing position pulse is output to the head control unit 42. Upon receiving a drawing position pulse, the head control unit 42 drives the head to eject the solution onto the substrate 1. That is, as shown in FIGS. 9A to 9H, when the head reaches the position where the conductive pattern and the insulating pattern are to be formed, it ejects the solutions from the predetermined nozzles of the nozzle arrays 30a, 30b of the head 2.

In this embodiment, the nozzle array 30a of the head is arranged in front of the nozzle array 30b with respect to the drawing direction. Therefore, when the conductive pattern and the insulating pattern are to be formed close together, the droplet 10 of the insulating solution is ejected prior to the droplet 11 of the conductive solution, as shown in FIGS. 9B and 9C, to cause the droplet 10 of the insulating solution to land on the substrate 1 before the droplet 11 of the conductive solution. As described above, when the insulating dots and the conductive dots are formed close to each other, the insulating dot situated in front of the conductive dot in the main scan direction is made to land on the substrate before the conductive dot.

With this method, if the landing positions of the droplets 11 of the conductive solution should somewhat deviate, the conductive pattern can be prevented from spreading, as shown in FIG. 9D, by the droplets 10 of the insulating solution that has already landed on the substrate 1 and, thus, acts as a blocking wall. Then, the substrate 1 is heated by the heater for fixing, and a first layer of pattern 12, as shown in FIG. 9E, is formed.

Next, a sequence of steps to form a second layer of pattern 13 over the first layer of pattern 12 will be explained.

First, to form the second layer of pattern 13, the liquid ejection head 2 is moved to the drawing operation start position (at the left end of the substrate 1). Then, while moving the head in the drawing direction (from left to right in the figure), the droplets 10 of the insulating solution and the droplets 11 of the conductive solution are ejected to the adjoining positions on the substrate 1. That is, as in the process of forming the first layer pattern 12, when forming the conductive pattern and the insulating pattern close together, the droplet 10 of insulating solution is ejected first, so that it lands on the substrate 1 prior to the droplet 11 of conductive solution. With this method, if the landing positions of the droplets 11 of conductive solution should somewhat deviate, the conductive pattern can be prevented from spreading by the insulating pattern, which has already landed on the substrate 1 and, thus, acts as a blocking wall. Thus, if the first layer of conductive pattern exists near the second layer of conductive pattern, these two conductive patterns are prevented from contacting each other. This means that the second layer of conductive pattern can be formed completely isolated from the first layer of conductive pattern, as shown in FIG. 9H.

As to the pattern forming process for the third and subsequent layer, though not shown, the similar method, as used in the forming of the second layer of pattern, can be used. In the first embodiment, the device may be constructed such that the head is fixed, with the substrate supported movable relative to the head.

Second Embodiment

Next, a second embodiment of this invention will be described.

FIGS. 10A to 10H are a rough sequence of steps showing a circuit pattern forming process in the second embodiment of this invention. While, in the first embodiment, the pattern forming operation is executed as the liquid ejection head is moved in only one direction (either in the forward direction or backward direction only), the second embodiment performs the pattern forming operation as the head moves in both directions (forward and backward directions). In the second embodiment, a liquid ejection head 3, schematically shown in FIG. 11, is employed.

Figure 11:
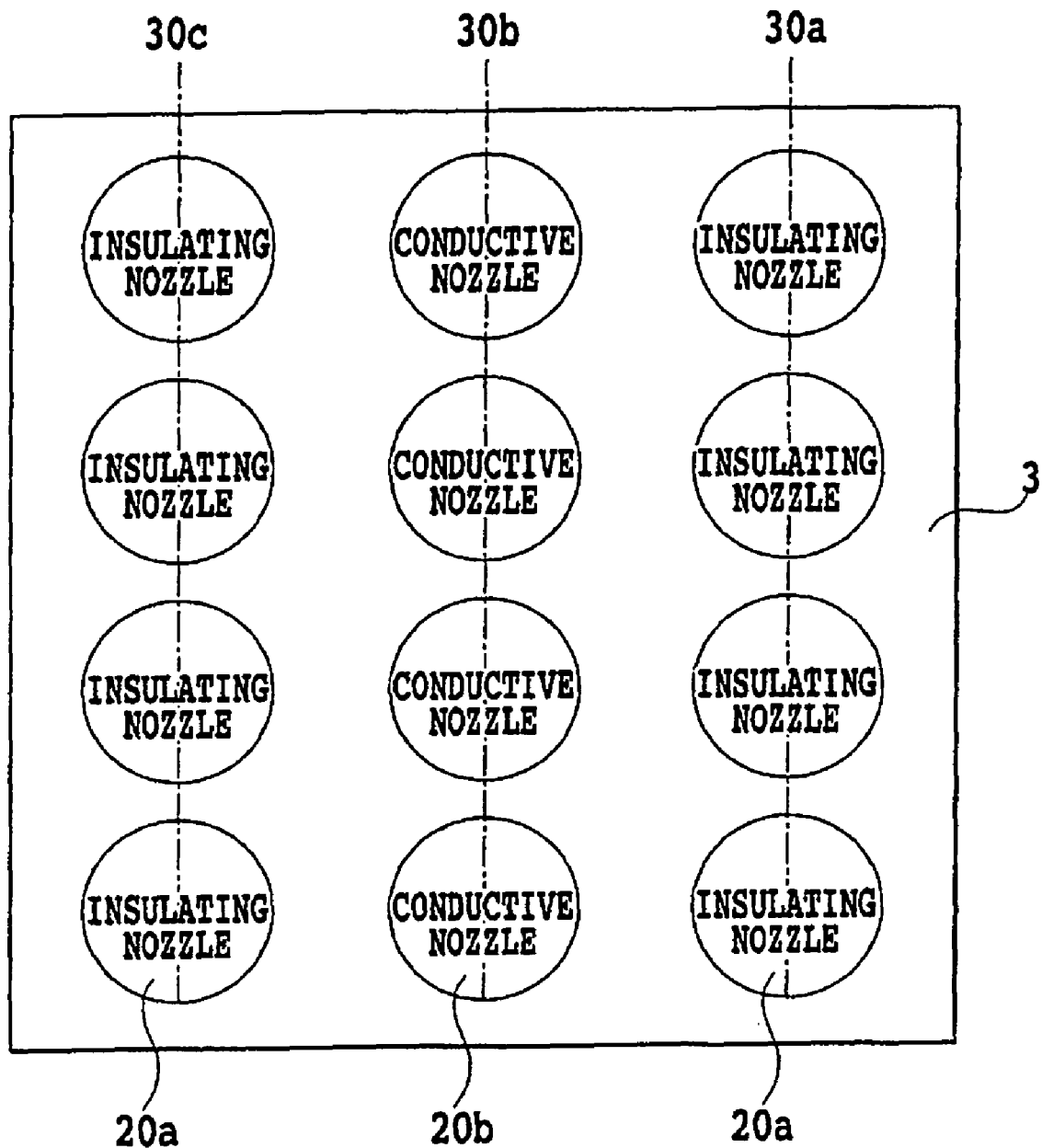
FIG. 11 is a bottom view schematically showing the liquid ejection head used in the second embodiment of this invention.

The liquid ejection head 3 of FIG. 11 has two nozzle arrays (first nozzle arrays) 30a, 30c, each of which has nozzles 20a arrayed in an orifice face at equal intervals, to eject droplets of insulating solution, and one nozzle array (second nozzle array), which has nozzles 20b arrayed at equal intervals to eject droplets of conductive solution, the first nozzle arrays and the second nozzle array being arranged side by side. The nozzle array 30b for ejecting the conductive solution is arranged parallel to and between the nozzle arrays 30a and 30c at a predetermined distance from them. Arranging these nozzle arrays in this manner ensures that the nozzle array for ejecting droplets of insulating solution (30a or 30c) is situated in front of the conductive solution ejection nozzle array, at all times, either when the head 3 is moved from left to right or from right to left in the figure.

In forming a circuit pattern on the substrate 1, the liquid ejection head 3 is first moved to the right end of the substrate 1, and the drawing operation start position, from which the head 3 is moved toward the left end of the substrate 1 shown in FIG. 10A (in the forward direction) as it ejects droplets, forming a first layer of pattern 12. The forming of the first layer is done by using the nozzle array 30c situated in the front with respect to the head moving direction and the following nozzle array 30b, and by performing the control similar to that of the first embodiment.

Next, in forming the second layer of pattern 13, the head 3 is moved from the position of FIG. 10A (at the left end of the substrate 1) as the drawing operation start position toward the right end of the substrate 1 (in the backward direction). During the movement, the head 3 ejects droplets 10 of insulating solution from the nozzles 20a of the nozzle array 30a and droplets 11 of conductive solution from the nozzles 20b of the nozzle array 30b, to form the second layer of pattern 13. During this process, the nozzle array 30a of the head 3 precedes the nozzle array 30b in the drawing direction (backward direction).

Therefore, when conductive patterns and insulating patterns are formed close together, droplets 10 of insulating solution are made to land on the substrate 1 before droplets 11 of conductive solution. With this arrangement, if the landing positions of droplets 11 of conductive solution should somewhat deviate, the conductive pattern can be prevented from spreading by the insulating pattern, which has already landed on the substrate 1 and, thus, acts as a blocking wall, thereby ensuring the forming of the conductive pattern with high precision. Thus, if the first layer of conductive pattern exists near the second layer of conductive pattern, these two conductive patterns can be kept isolated from each other, as shown in FIG. 10D. Then, the substrate 1, with the second layer of pattern 13 on it, is heated by the heater for fixing, and the second layer of pattern 13, as shown in FIG. 10E, is formed.

Next, the process of forming a third layer of pattern 14 will be explained.

When the second layer of pattern is formed as described above, the liquid ejection head 3 is situated at the right end of the substrate 1. The drawing of the third layer is performed from this position as the drawing operation start position. That is, the head 3 is moved from the right end of the substrate 1 toward the left (in the forward direction). Then, as the head 3 is moved, droplets 10 of insulating solution are ejected from the nozzles 20a of the nozzle array 30c and droplets 11 of conductive solution are ejected from the nozzles 20b of the nozzle array 30b. In the pattern forming of the third layer, too, the nozzle array 30c situated in the front in the forward direction and the nozzle array 30b on the rear side are used for drawing, as in the first layer pattern forming.

Therefore, when conductive patterns and insulating patterns are formed close together, the head 3 ejects droplets first from the nozzle array 30c, prior to the nozzle array 30b, to cause the droplets of insulating solution to land on the substrate 1 before the droplets of conductive solution. With this arrangement, if the landing positions of droplets 11 of conductive solution should somewhat deviate, the conductive pattern can be prevented from spreading by the droplets 10 of insulating solution, that have already landed on the substrate 1 and, thus, acts as a blocking wall, thereby forming the conductive pattern with high precision. Thus, when a third layer of conductive pattern 14 is formed near the second layer of conductive pattern 13, they can be prevented from contacting each other. As a result, an appropriate isolated state, as shown in FIG. 10H, can be obtained.

As to the pattern forming process for the fourth and subsequent layer, though not shown, a similar method as that used in the forming of the second and third layer of pattern can be used. That is, the pattern forming is done by selecting the nozzle array to be used to eject droplets 10 of insulating solution, according to the moving direction of the head 3. For example, when the drawing direction of the head 3 is from left to right in the figure, the head 3 uses the nozzle array 30a; and when the drawing direction is from right to left, it uses the nozzle array 30c.

While the second embodiment of this invention has been described to use the head 3 having three nozzle arrays as shown in FIG. 11, the head 3 may be replaced with the head 2 of FIG. 2. When the head 2 is used, the head 2 needs to be rotated one hundred eighty degrees, so that the nozzle array for ejecting droplets of insulating solution is always situated in front of the nozzle array for ejecting droplets of conductive solution in the drawing direction.

Third Embodiment

Next, a third embodiment of this invention will be described.

FIG. 12 and FIGS. 13A to 13D are schematic diagrams showing a circuit pattern forming process in the third embodiment of this invention.

In the third embodiment, the order, in which the droplets 10 of insulating solution and the droplets 11 of conductive solution land on the substrate 1, is shown in FIGS. 13A to 13D. In this third embodiment, the head 3 of FIG. 11 is used.

Figure 12:
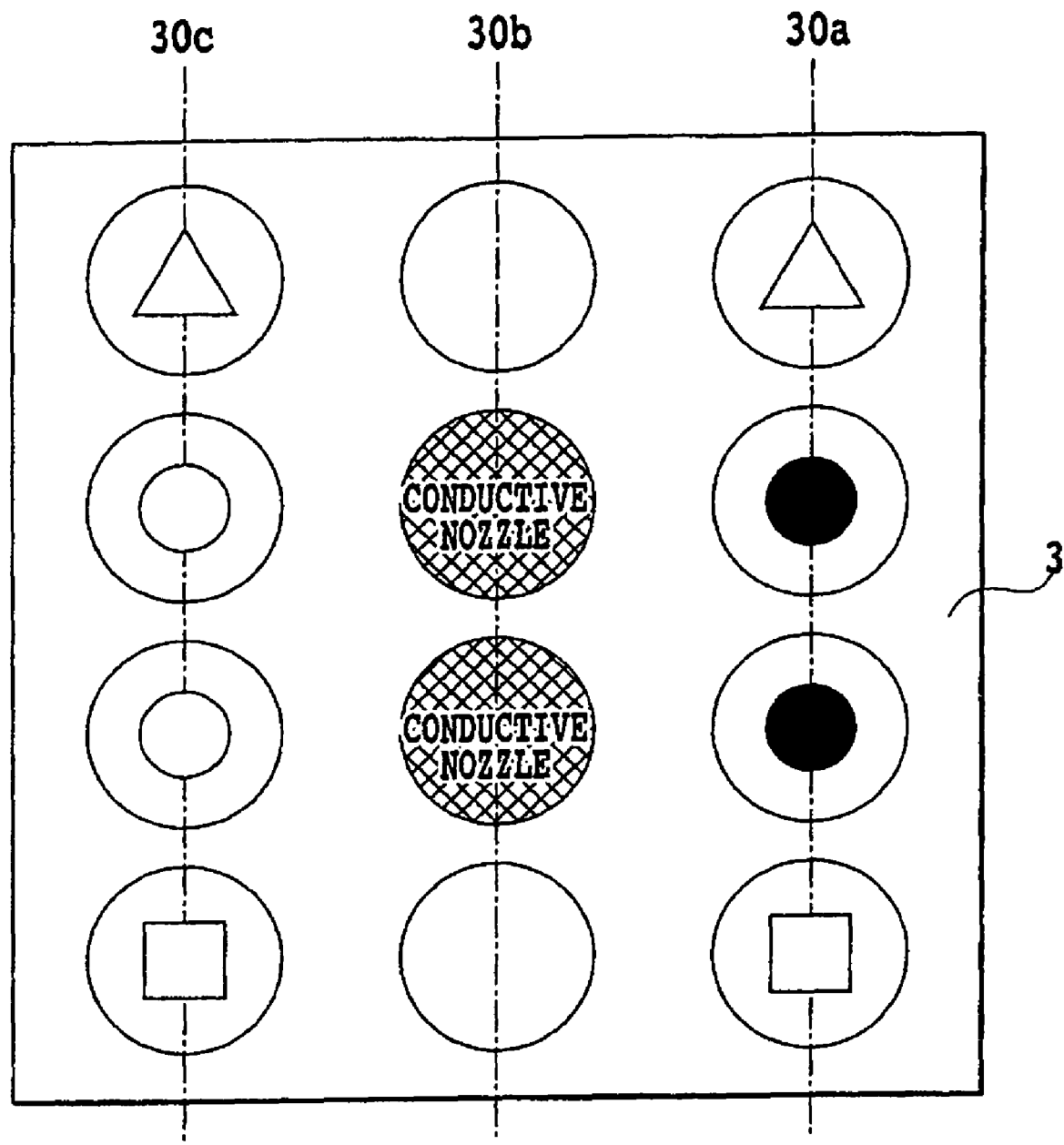
FIG. 12 is a bottom view schematically showing the liquid ejection head used in the third embodiment of this invention.

FIG. 12 shows a nozzle arrangement of the head 3 using five kinds of symbols, for ease of explanation. As for the nozzles to eject droplets of insulating solution, there are four kinds in total—two nozzles of the nozzle array 30a represented by (●), two nozzles of the nozzle array 30c by (○), the uppermost nozzles of the nozzle array 30a and nozzle array 30c by (△), and the lowermost nozzles of the nozzle array 30a and the nozzle array 30c by (□). Of the nozzles for ejecting droplets of conductive solution, only two middle nozzles (shown shaded) are used.

Figure 13A:
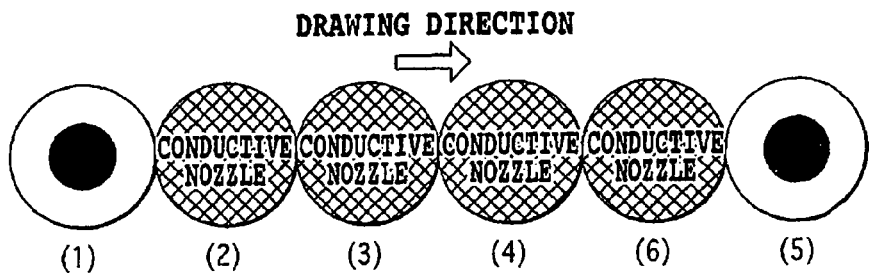
FIGS. 13A to 13D are schematic diagrams showing a circuit pattern forming process in a third embodiment of this invention.

By referring to FIG. 12, the order in which the droplets 10 of the insulating solution and the droplets 11 of conductive solution land on the substrate 1 will be explained. FIGS. 13A to 13D show droplets that have landed on the substrate 1. For example, droplets ejected from the nozzles (●) correspond to the droplets (●) in FIG. 13A. FIG. 13A represents a case where the head 3 draws as it moves from left to right, with (1) to (6) representing landing positions and their landing order. The drawing operation shown in FIG. 13A is performed under the almost similar ejection position control to that of the second embodiment.

When the head 3 moves to the position indicated by (1), it ejects a droplet (●) of insulating solution from the nozzle array 30a, landing on a position (1). Next, as the nozzle array 30b of the head 3 moves to positions indicated by (2), (3) and (4), the nozzle array 30b ejects droplets of conductive solution (shown shaded) successively, landing on respective positions. Then, since the nozzle array 30a of the head 3 is situated in front of the nozzle array 30b in the direction of movement (in the forward direction), when the nozzle array 30a reaches the right end position indicated by (5), the nozzle array 30a ejects a droplet (●) of insulating solution, landing at the position (5). After this, when the nozzle array 30b reaches the position (6), it ejects a droplet of conductive solution (shown shaded), landing on the position (6).

Figure 13B:
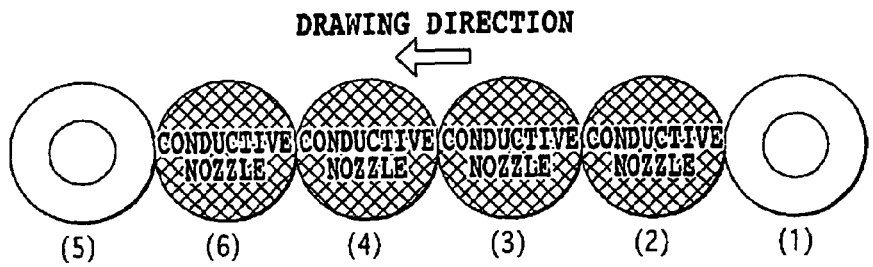

FIG. 13B shows a case in which the head 3 draws as it travels from right to left, with (1) to (6) representing landing positions and their landing order. The drawing operation shown in FIG. 13B is performed under the similar ejection position control to that of FIG. 13A. First, a droplet of insulating solution (○) lands at position (1), followed by droplets of conductive solution (shown shaded) landing at positions (2), (3) and (4) successively. Then, after a droplet (○) has landed on position (5) at the left end, a droplet (shown shaded) lands at position (6).

Figure 13C:
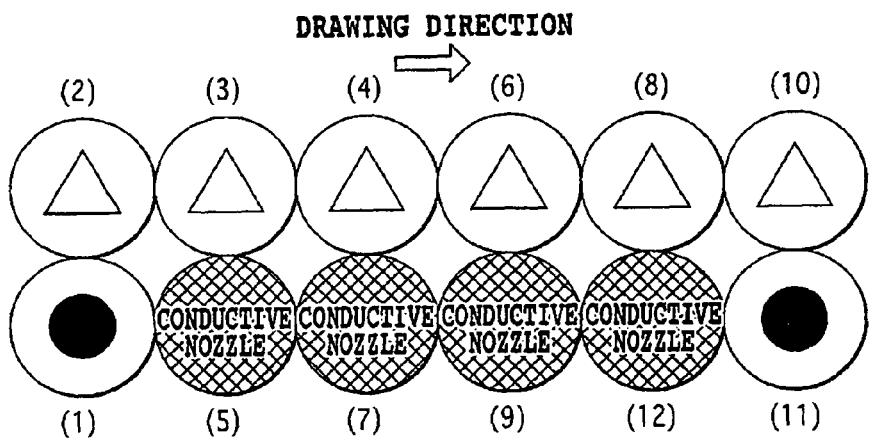
Figure 13D:
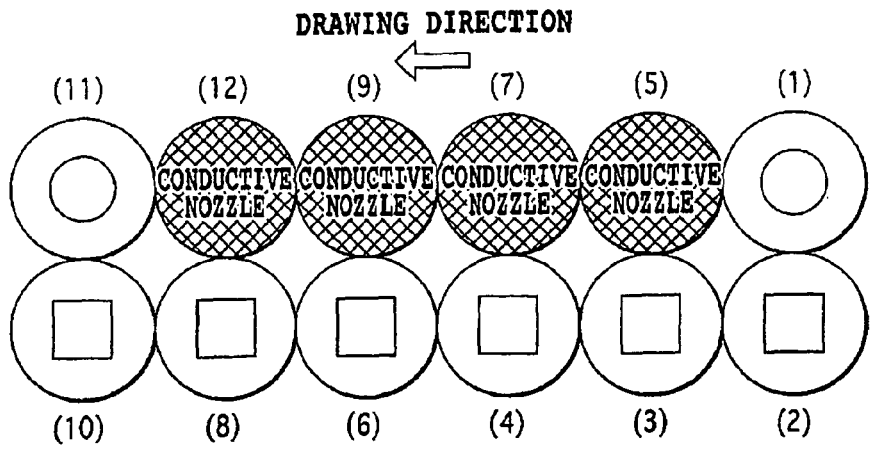
Figure 14A:
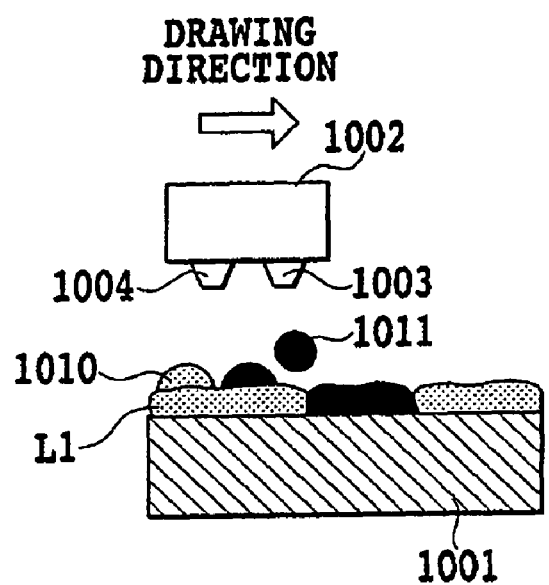
FIGS. 14A and 14B illustrate a conventional circuit pattern forming process.
Figure 14B:
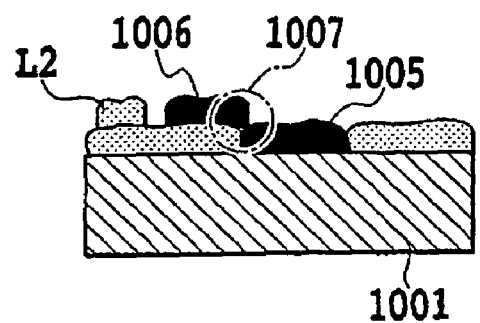

FIG. 13C shows a case in which the drawing is performed by moving the head from left to right in the figure, with (1) to (12) representing landing positions and their landing order. First a droplet (●) of insulating solution lands at position (1). Then droplets (△) land at positions (2), (3) and (4) to prevent the droplet of conductive solution from spreading to the surrounding area. After this, a droplet of conductive solution (shown shaded) lands at position (5). At positions from (6) to (9), a droplet (△) and a droplet (shown shaded) land alternately. Next, a droplet (△) lands at position (10) at the upper right end and a droplet (●) lands at position (11) at the lower right end successively. Then, finally, a droplet (shown shaded) lands at position (12). The drawing operation shown in FIG. 13D represents a case in which the head 3 draws as it moves from right to left in the figure, with (1) to (12) representing the order of landing. First, a droplet (○) of insulating solution lands at position (1). Next, droplets (□) land at positions (2), (3) and (4). This is followed by a droplet of conductive solution (shown shaded) landing at position (5). Next, at positions from (6) to (9), a droplet (□) and a droplet (shown shaded) land alternately. Then, a droplet (□) lands at position (10) at the lower left end and a droplet (○) lands at position (11) at the upper left end. And, finally, a droplet (shown shaded) lands at position (12). When insulating dots and conductive dots are formed close to each other, the insulating dots situated on the main scan direction side are formed on the substrate prior to the conductive dots.

What is meant by the "insulating dots situated on the main scan direction side with respect to the conductive dots" includes dots formed close together in the main scan direction, such as a dot (shown shaded) at position (12) and dots (○, ●, □, △) at position (11) in FIG. 13C, and insulating dots (close to conductive dots) that are situated next (in a scan direction crossing the main scan direction) to dots formed close together in the main scan direction, such as a dot (shown shaded) at position (5) and a dot (△) at position (4) in FIG. 13C.

As shown in FIGS. 13A to 13D, in the third embodiment, if the landing positions of the droplets of conductive solution (shown shaded) should somewhat deviate, since the droplets (●) of insulating solution always land on the substrate 1 prior to the conductive solution droplets, the insulating solution droplets act as a blocking wall preventing the conductive solution droplets from spreading. This, in turn, makes it possible to form highly dense circuit patterns with high precision and eliminates the problem that closely situated conductive wires become short-circuited within the same layer and between different layers.

While FIGS. 13A to 13D show an example case in which one conductive pattern is formed in the scan direction, the present invention can also be applied to cases in which a plurality of conductive patterns are formed close together, or cases in which the conductive patterns are formed in curves. The shapes of the conductive patterns are not limited to those shown in the above embodiments.

In the second and third embodiments, the device may be constructed such that the head is fixed, with the substrate supported movable relative to the head.

The present invention has been described in detail with respect to preferred embodiments, and it will now be apparent from the foregoing to those skilled in the art that changes and modifications may be made without departing from the invention in its broader aspect, and it is the intention, therefore, in the claims, to cover all such changes.

What is claimed is:

1. A circuit pattern forming device comprising:
    liquid ejection means for ejecting an insulating pattern forming solution and a conductive pattern forming solution onto a substrate to form insulating dots of the insulating solution and conductive dots of the conductive solution on the substrate;
    control means for controlling an ejection operation which the liquid ejection means performs for each of the solutions; and
    moving means for moving the liquid ejection means and the substrate relative to each other to form a circuit pattern composed of a plurality of the conductive dots and the insulating dots,
    wherein the liquid ejection means comprises a first nozzle array in which a plurality of nozzles for ejecting the insulating solution are arranged along a crossing direction crossing a main scan direction, and a second nozzle array in which a plurality of nozzles for ejecting the conductive solution are arranged along the crossing direction, the first nozzle array being disposed in front of the second nozzle array with respect to the main scan direction and the second nozzle array being arranged between a plurality of the first nozzle arrays, and
    wherein the control means performs control such that when the insulating dots and the conductive dots are formed close to each other on the substrate, the insulating dots which are positioned in a direction in which the liquid ejection means moves relative to the substrate, are formed on the substrate prior to the conductive dots in a same main scan performed by the liquid ejection means.

2. A circuit pattern forming device according to claim 1, wherein the liquid ejection means has at least one of the second nozzle array arranged parallel to the first nozzle arrays,
    wherein the moving means moves the liquid ejection means and the substrate relative to each other in a forward direction and in a backward direction with respect to the main scan direction, and
    wherein the control means enables each of the nozzle arrays to eject droplets during the relative movement of the liquid ejection means in the forward direction and in the backward direction.

3. A circuit pattern forming device according to claim 2, further comprising:
    position detection means to detect a position of the liquid ejection means; and
    moving direction decision means for checking whether a scan in which the liquid ejection means is going to execute is the movement in the forward direction or in the backward direction,
    wherein the control means controls an ejection operation of the liquid ejection means according to position information output from the position detection means, a moving direction determined by the moving direction decision means, and data of the circuit pattern to be formed on the substrate.

* * * * *